(12) United States Patent
Min et al.

(10) Patent No.: US 9,699,885 B2
(45) Date of Patent: Jul. 4, 2017

(54) CIRCUIT BOARD INCLUDING HEAT DISSIPATION STRUCTURE

(71) Applicant: Samsung Electro-Mechanics Co., Ltd., Suwon-Si (KR)

(72) Inventors: Tae Hong Min, Suwon-Si (KR); Myung Sam Kang, Hwaseong-si (KR); Young Gwan Ko, Seoul (KR); Min Jae Seong, Mungyeong-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/870,741

(22) Filed: Sep. 30, 2015

(65) Prior Publication Data
US 2016/0095198 A1  Mar. 31, 2016

(30) Foreign Application Priority Data
Sep. 30, 2014  (KR) .................. 10-2014-0131228

(51) Int. Cl.
| | | |
|---|---|---|
| H05K 1/00 | (2006.01) |
| H05K 1/02 | (2006.01) |
| H05K 3/46 | (2006.01) |
| H05K 1/18 | (2006.01) |
| H05K 1/14 | (2006.01) |

(52) U.S. Cl.
CPC ......... H05K 1/0206 (2013.01); H05K 3/4608 (2013.01); *H05K 1/023* (2013.01); *H05K 1/0207* (2013.01); *H05K 1/141* (2013.01); *H05K 1/185* (2013.01); *H05K 2201/041* (2013.01)

(58) Field of Classification Search
CPC .. H05K 1/0206; H05K 1/0207; H05K 3/4608; H05K 1/023; H05K 1/141; H05K 1/185
USPC ......... 174/252, 250, 251, 255–258, 260–262
See application file for complete search history.

(56) References Cited

U.S. PATENT DOCUMENTS

2009/0215231 A1*  8/2009  Inoue ............. H01L 24/82
  438/125
2013/0269986 A1*  10/2013  Sun ............. H05K 1/0204
  174/252

FOREIGN PATENT DOCUMENTS

JP       11-284300 A    10/1999

\* cited by examiner

*Primary Examiner* — Tremesha S Willis
(74) *Attorney, Agent, or Firm* — NSIP Law

(57) ABSTRACT

Disclosed herein is a circuit board. According to an exemplary embodiment of the present disclosure, a circuit board has a structure in which at least a portion of a first heat transfer structure in which a metal layer and an insulating layer are alternately stacked is inserted into an insulating part.

17 Claims, 8 Drawing Sheets

CIRCUIT BOARD INCLUDING HEAT DISSIPATION STRUCTURE

This application claims the benefit under 35 U.S.C. Section [120, 119, 119(e)] of Korean Patent Application Serial No. 10-2014-0131228, entitled "Circuit Board Including Heat Dissipation Structure" filed on Sep. 30, 2014, which is hereby incorporated by reference in its entirety into this application.

BACKGROUND OF THE INVENTION

1. Technical Field

The present disclosure relates to a circuit board including a heat dissipation structure.

2. Description of the Related Art

To keep pace with a trend toward weight reduction, miniaturization, speed up, multi-functionalization, and improvement in performance of electronic devices, multi-layered substrate technologies in which a plurality of wiring layers are formed on a circuit board such as a printed circuit board (PCB) have been developed. Further, technologies of mounting electronic components such as active devices or passive devices on a multilayered substrate have also been developed.

Meanwhile, as the function and performance of an application processor (AP), and the like which are connected to the multilayered substrate are sophisticated, a heat value has been remarkably increased.

RELATED ART DOCUMENT

Patent Document (Patent Document 1) Japanese Patent Laid-Open Publication No. 1999-284300

SUMMARY OF THE INVENTION

An object of the present disclosure is to provide a circuit board which may realize at least one of improvement in heat dissipation performance, compactization and miniaturization, improvement in reliability, reduction in noise, and improvement in manufacturing efficiency.

Objects of the present disclosure are not limited to the above-mentioned objects. That is, other objects that are not mentioned may be obviously understood by those skilled in the art to which the present disclosure pertains from the following description.

According to an exemplary embodiment of the present disclosure, there is provided a circuit board including a first heat transfer structure in which a metal layer and an insulting layer are alternately stacked.

According to an exemplary embodiment of the present disclosure, a surface of the first heat transfer structure may be provided with a primer layer.

Further, according to another exemplary embodiment of the present disclosure, a surface of the first heat transfer structure may be provided with a copper plating layer and may also be provided with the copper plating layer and a primer layer together.

DESCRIPTION OF THE PREFERRED EMBODIMENTS

Figure 1:
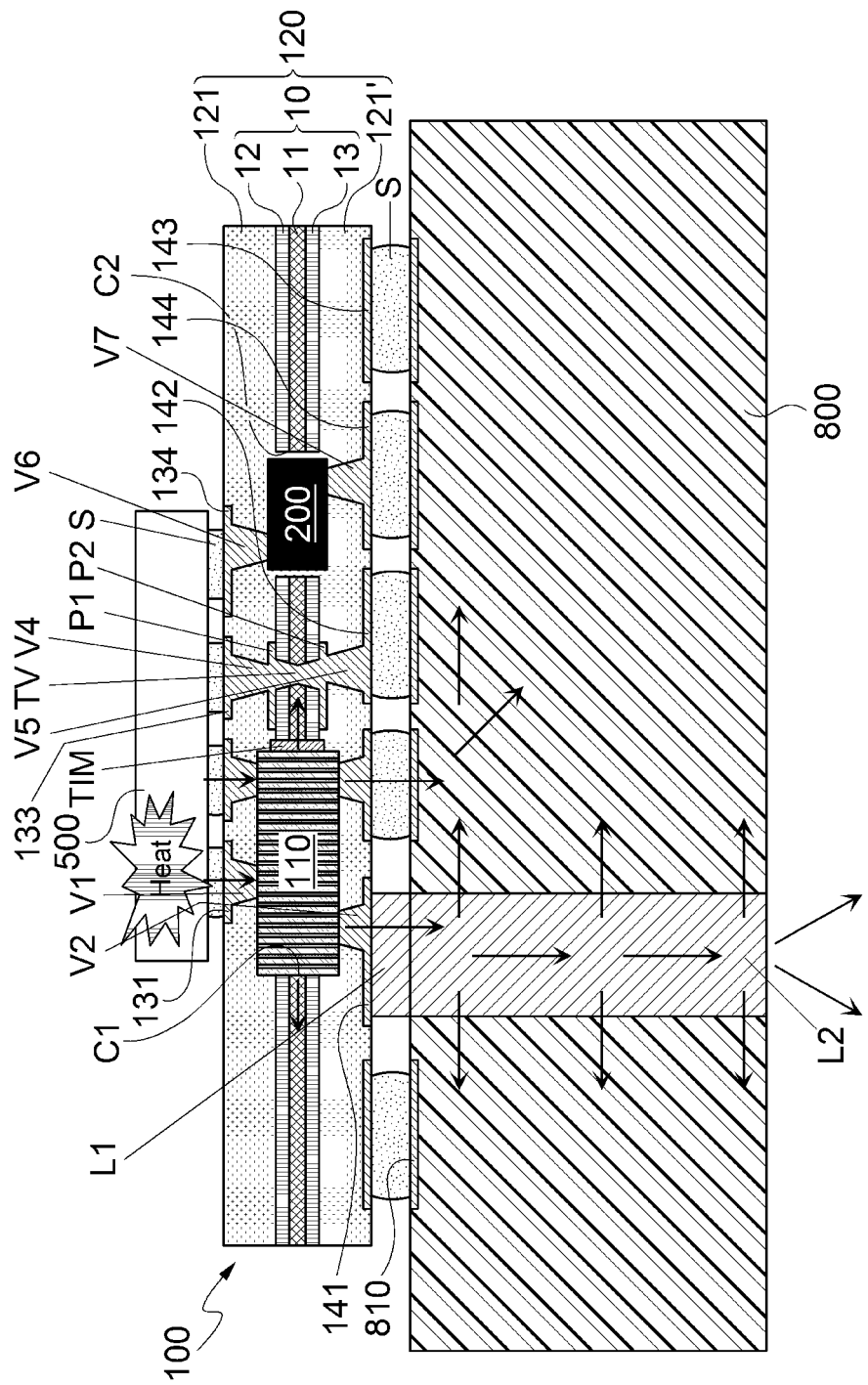
FIG. 1 is a cross-sectional view schematically illustrating a circuit board according to an exemplary embodiment of the present disclosure.

Terms used in the present specification are for explaining the specific embodiments rather than limiting the present disclosure. Unless explicitly described to the contrary, a singular form includes a plural form in the present specification. Also, used herein, the word "comprise" and/or "comprising" will be understood to imply the inclusion of stated constituents, steps, numerals, operations and/or elements but not the exclusion of any other constituents, steps, numerals, operations and/or elements.

The above and other objects, features and advantages of the present disclosure will be more clearly understood from preferred embodiments and the following detailed description taken in conjunction with the accompanying drawings. In the specification, in adding reference numerals to components throughout the drawings, it is to be noted that like reference numerals designate like components even though components are shown in different drawings. Further, when it is determined that the detailed description of the known art related to the present disclosure may obscure the gist of the present disclosure, the detailed description thereof will be omitted. In the description, the terms "first", "second", and so on are used to distinguish one element from another element, and the elements are not defined only by the above terms.

Hereinafter, exemplary embodiments of the present disclosure will be described in detail with reference to the accompanying drawings.

Figure 2:
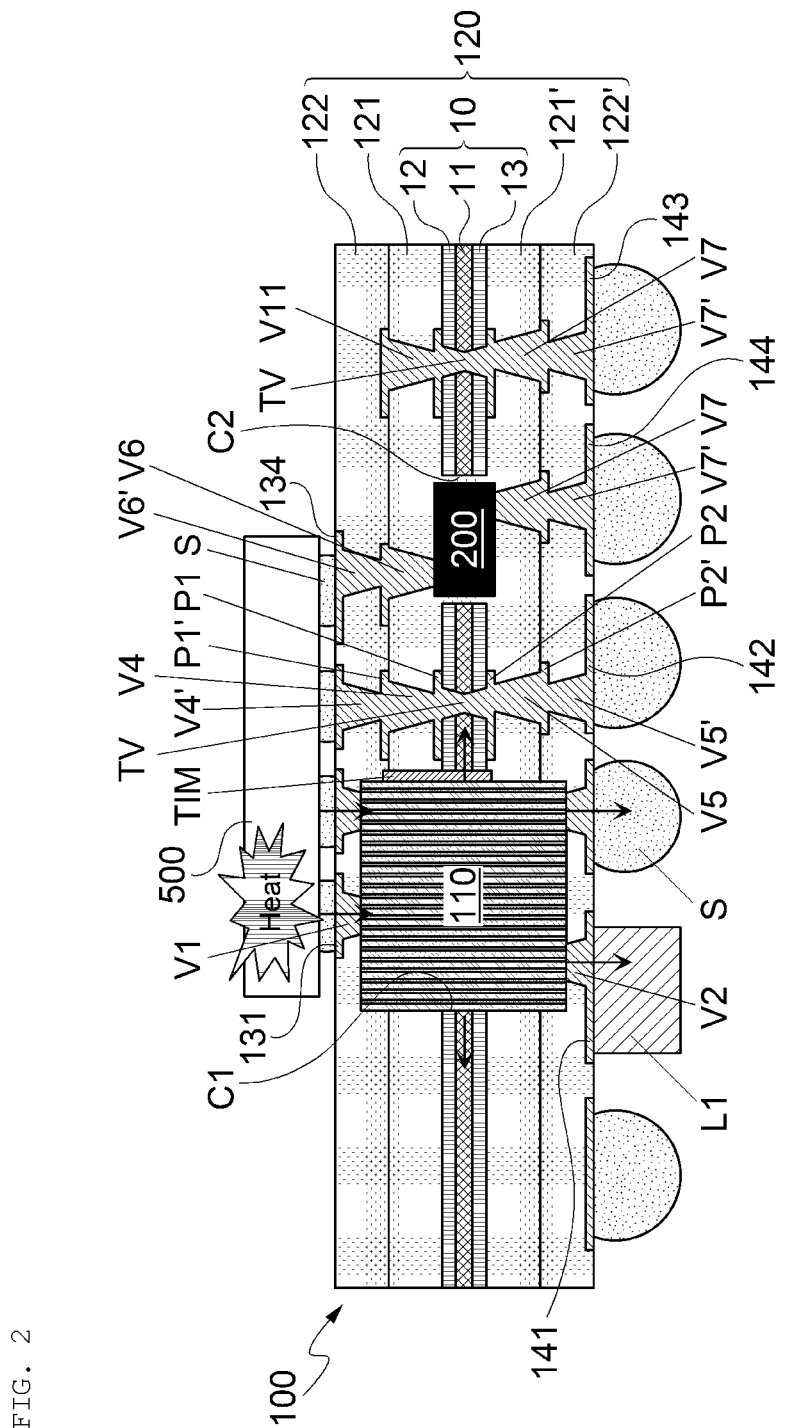
FIG. 2 is a cross-sectional view schematically illustrating a circuit board according to another exemplary embodiment of the present disclosure.
Figure 3A:
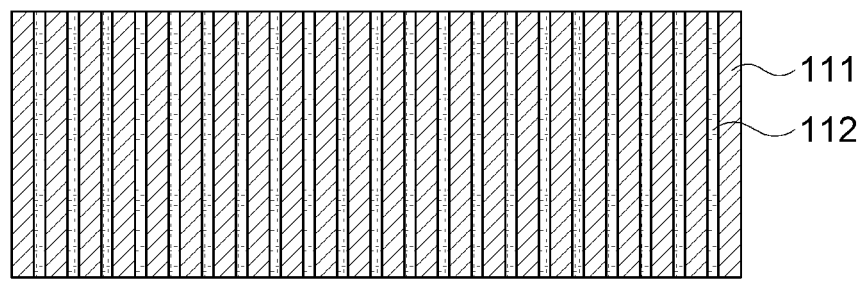
FIG. 3A is a cross-sectional view of a first heat transfer structure according to an exemplary embodiment of the present disclosure.
Figure 3B:
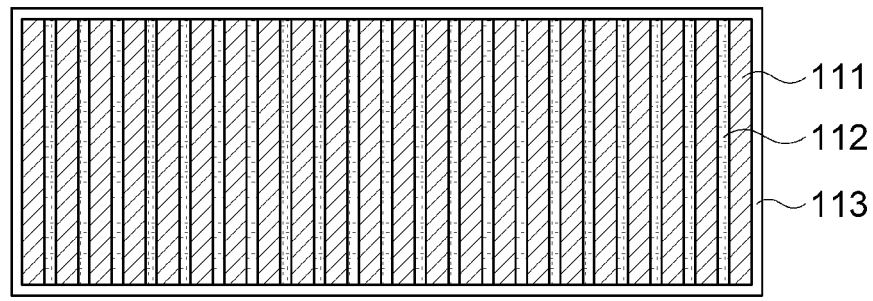
FIG. 3B is a cross-sectional view of the first heat transfer structure according to the exemplary embodiment of the present disclosure of which the surface is provided with a primer layer.
Figure 3C:
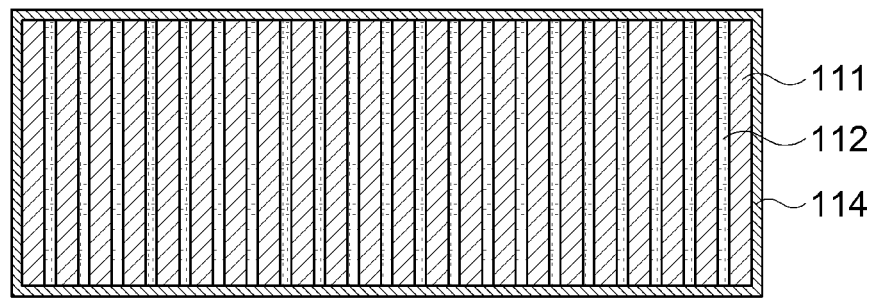
FIG. 3C is a cross-sectional view of the first heat transfer structure according to the exemplary embodiment of the present disclosure of which the surface is provided with a copper plating layer.
Figure 3D:
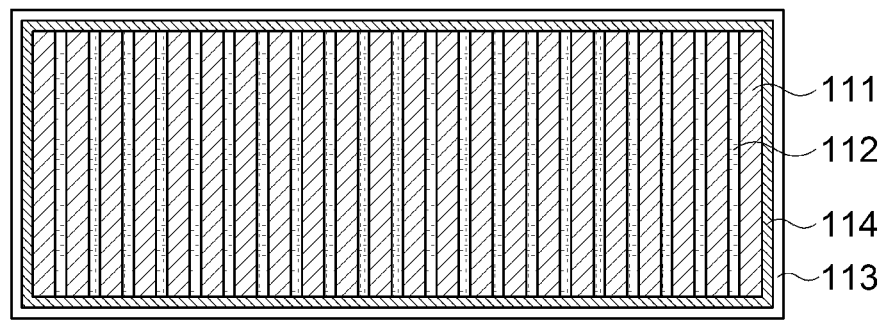
FIG. 3D is a cross-sectional view of the first heat transfer structure according to the exemplary embodiment of the present disclosure of which the surface is provided with the copper plating layer and the primer layer.
Figure 4A:
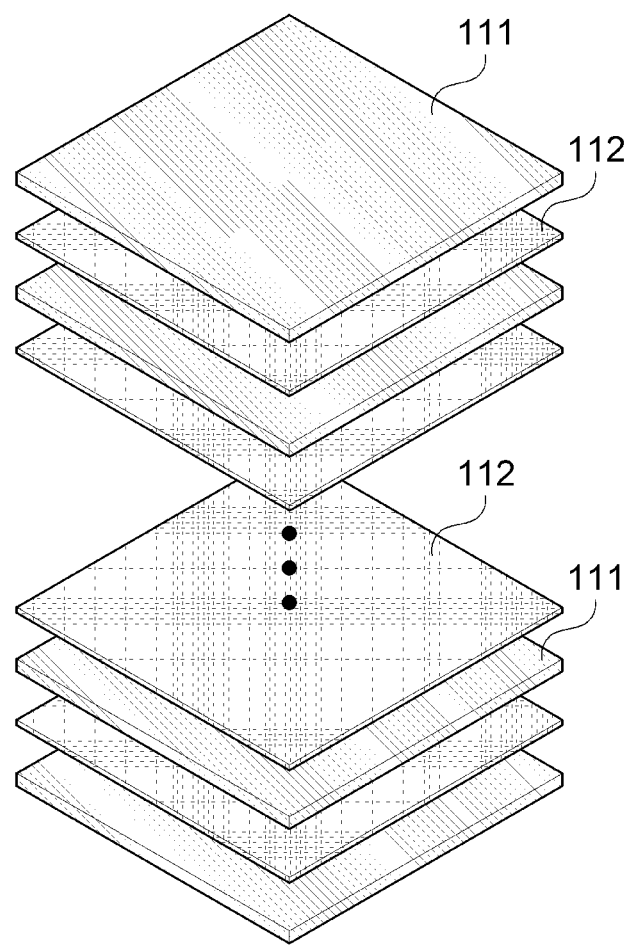
FIG. 4A is a perspective view of the first heat transfer structure before a copper layer and an insulating layer are compressed, in a process of manufacturing the first heat transfer structure according to the exemplary embodiment of the present disclosure.
Figure 4B:
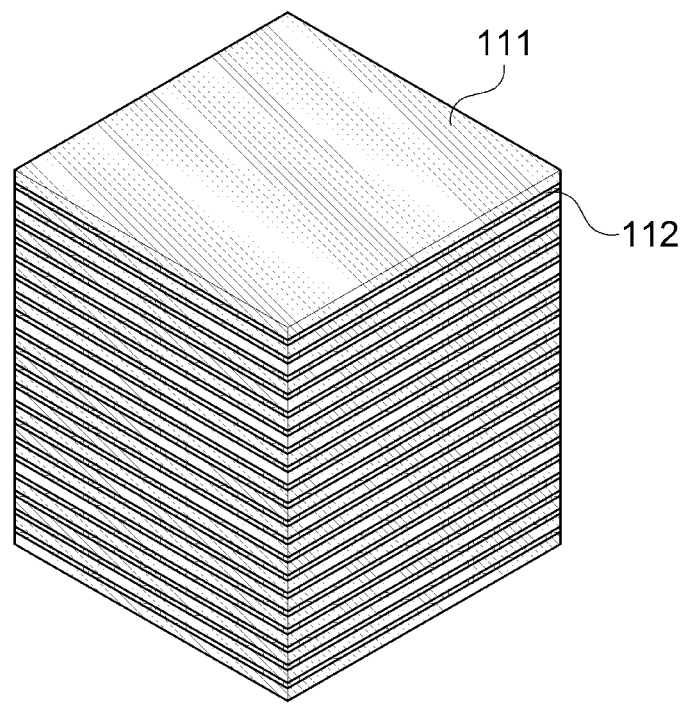
FIG. 4B is a perspective view of the first heat transfer structure after the copper layer and the insulating layer are compressed, in the process of manufacturing the first heat transfer structure according to the exemplary embodiment of the present disclosure.
Figure 4C:
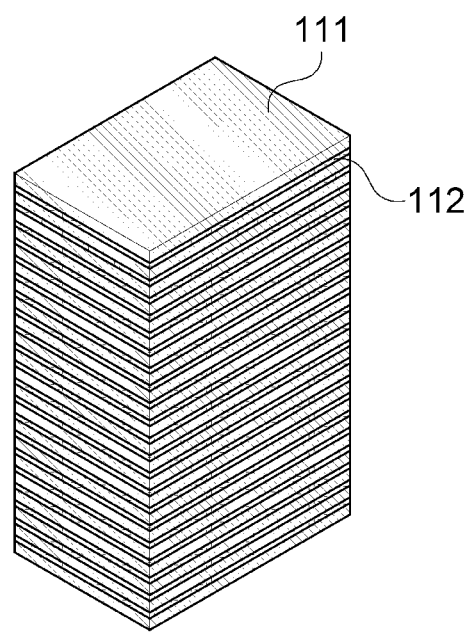
FIG. 4C is a perspective view of the first heat transfer structure which is separated apiece by sawing after the cooper layer and the insulating layer are compressed, in the process of manufacturing the first heat transfer structure according to the exemplary embodiment of the present disclosure.
Figure 4D:
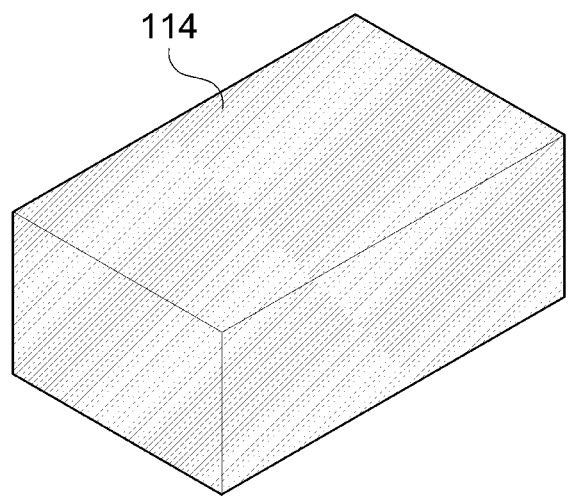
FIG. 4D is a perspective view of the first heat transfer structure after the surface of the first heat transfer structure which is separated apiece is provided with the copper plating layer, in the process of manufacturing the first heat transfer structure according to the exemplary embodiment of the present disclosure.
Figure 5:
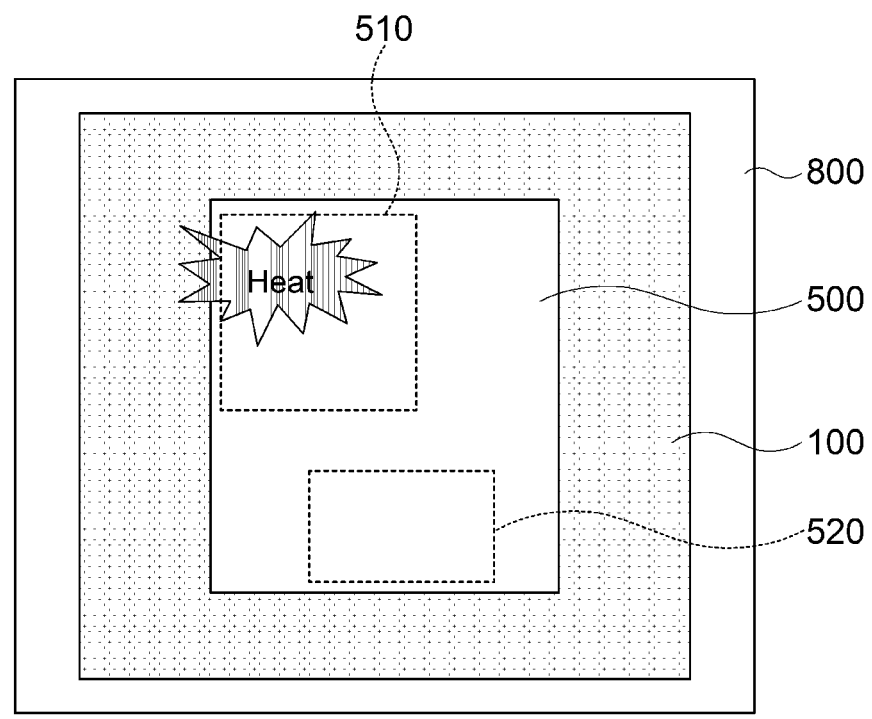
FIG. 5 is an exemplified diagram schematically illustrating a plane shape of the circuit board according to the exemplary embodiment of the present disclosure.
Figure 6:
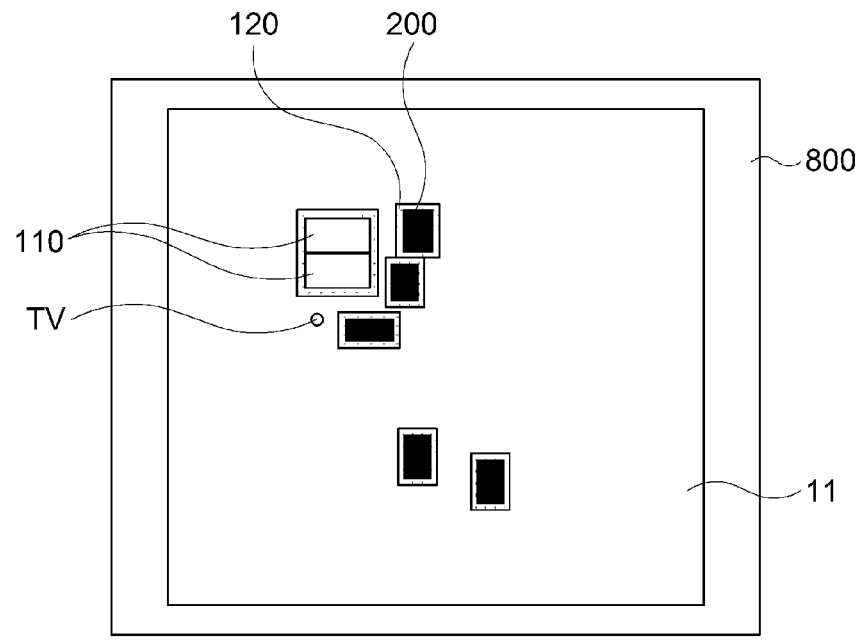
FIG. 6 is a horizontal cross-sectional view schematically illustrating the circuit board according to the exemplary embodiment of the present disclosure.
Figure 7:
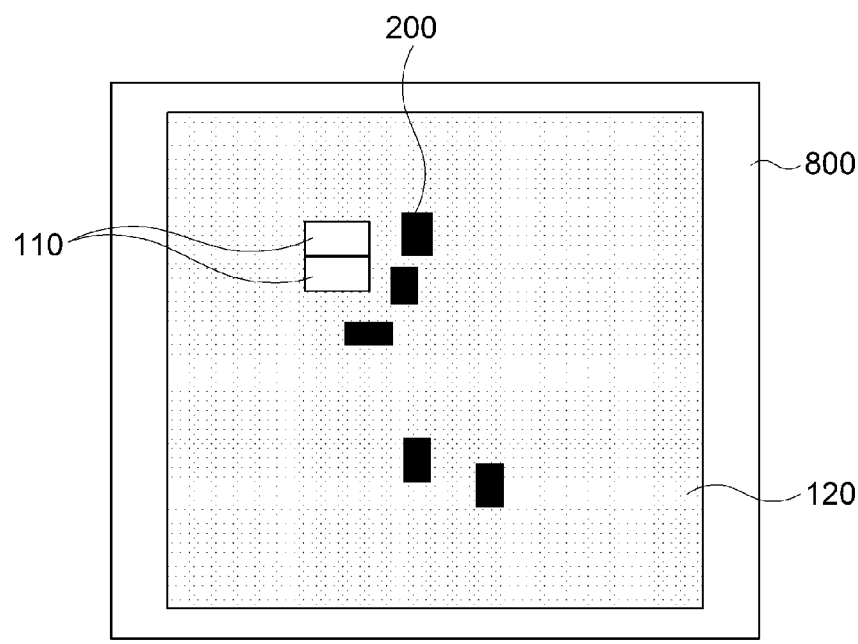
FIG. 7 is a horizontal cross-sectional view schematically illustrating a circuit board according to another exemplary embodiment of the present disclosure.
Figure 8:
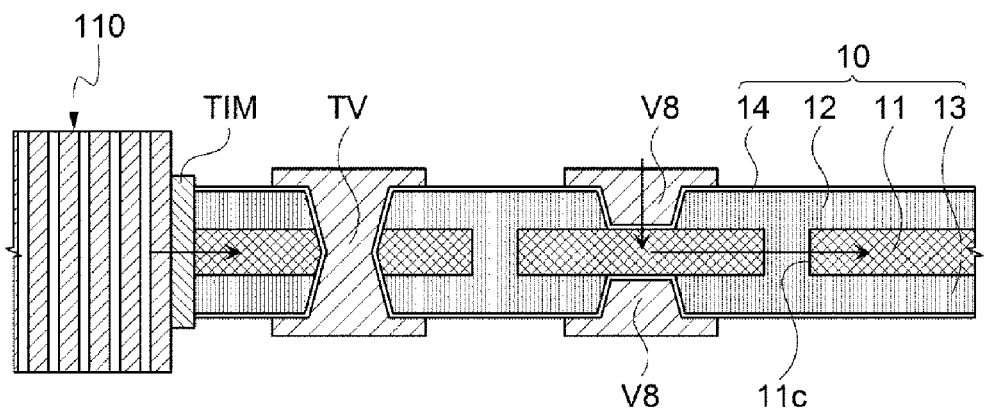
FIG. 8 is a partially extracted cross-sectional view schematically illustrating main parts of the circuit board according to the exemplary embodiment of the present disclosure.

FIG. 1 is a cross-sectional view schematically illustrating a circuit board 100 according to an exemplary embodiment of the present disclosure; FIG. 2 is a cross-sectional view schematically illustrating a circuit board 100 according to another exemplary embodiment of the present disclosure; FIG. 3A is a cross-sectional view of a first heat transfer structure according to an exemplary embodiment of the present disclosure; FIG. 3B is a cross-sectional view of the first heat transfer structure according to the exemplary embodiment of the present disclosure of which the surface is provided with a primer layer; FIG. 3C is a cross-sectional view of the first heat transfer structure according to the exemplary embodiment of the present disclosure of which the surface is provided with a copper plating layer; FIG. 3D is a cross-sectional view of the first heat transfer structure according to the exemplary embodiment of the present disclosure of which the surface is provided with the copper plating layer and the primer layer; FIG. 4A is a perspective view of the first heat transfer structure before a copper layer and an insulating layer are compressed, in a process of manufacturing the first heat transfer structure according to the exemplary embodiment of the present disclosure; FIG. 4B is a perspective view of the first heat transfer structure after the copper layer and the insulating layer are compressed, in the process of manufacturing the first heat transfer structure according to the exemplary embodiment of the present disclosure; FIG. 4C is a perspective view of the first heat transfer structure which is separated apiece by sawing after the cooper layer and the insulating layer are compressed, in the process of manufacturing the first heat transfer structure according to the exemplary embodiment of the present disclosure; FIG. 4D is a perspective view of the first heat transfer structure after the surface of the first heat transfer structure which is separated apiece is provided with the copper plating layer, in the process of manufacturing the first heat transfer structure according to the exemplary embodiment of the present disclosure; FIG. 5 is an exemplified diagram schematically illustrating a plane shape of the circuit board 100 according to the exemplary embodiment of the present disclosure; FIG. 6 is a horizontal cross-sectional view schematically illustrating the circuit board 100 according to the exemplary embodiment of the present disclosure; FIG. 7 is a horizontal cross-sectional view schematically illustrating a circuit board 100 according to another exemplary embodiment of the present disclosure; and FIG. 8 is a partially extracted cross-sectional view schematically illustrating main parts of the circuit board 100 according to the exemplary embodiment of the present disclosure.

The circuit board 100 according to the exemplary embodiment of the present disclosure includes a first heat transfer structure 110 at least a portion of which is inserted into an insulating part 120. In this case, the first heat transfer structure 110 has a shape in which a metal layer and an insulating layer are alternately stacked.

Referring to FIGS. 1, 2, and 3A, the first heat transfer structure 110 has a metal layer 111 and an insulating layer 112 alternately stacked therein and the metal layer 111 and the insulating layer 112 are mounted to be vertically aligned, to thereby increase heat transfer efficiency in a vertical direction of the circuit board when the first heat transfer structure 110 is mounted on the circuit board.

Referring to FIGS. 3A to 3D, the first heat transfer structure 110 may be implemented in various forms.

According to the exemplary embodiment of the present disclosure, the first heat transfer structure 110 may be formed by alternately stacking the metal layer 111 and the insulating layer 112 (FIG. 3A) and according to another exemplary embodiment of the present disclosure, the surface of the first heat transfer structure 110 may be provided with a primer layer 113 as a means for improving an adhesion with the insulating part 120 (FIG. 3B).

When the surface of the first heat transfer structure 110 directly contacts the insulating part 120, a phenomenon that the first heat transfer structure 110 and the insulating part 120 are spaced apart from each other while the reflow process, the solder pot process, and the like are progressed may occur, which is referred to as a delamination phenomenon. In this case, as a means for improving the adhesion with the insulating part 120, the primer layer 113 which is provided on the surface of the first heat transfer structure 110 may be provided. According to the exemplary embodiment of the present disclosure, the primer layer 113 may include a silane-based material or acrylic silane, and in detail, may be made of 3-(trimethoxysilyl)propylmethacrylate (MPS) and may be added with adhesives.

Further, the surface of the first heat transfer structure 110 may be provided with a cooper plating layer 114 (FIG. 3C) and may be provided with the copper plating layer 114 and the primer layer 113 together, in which on the cooper plating layer 114 may be formed the primer layer 113 (FIG. 3D).

When the surface of the first heat transfer structure 110 is provided with the copper plating layer 114, heat may be partially transferred even in a length direction, and thus the number of metal layers 111 which serve as a thermal channel may be increased, such that heat dissipation performance of the first heat transfer structure 110 may be improved.

According to the exemplary embodiment of the present disclosure, the first heat transfer structure 110 may have a cylindrical shape or a polygonal pillar shape. Further, the metal layer of the first heat transfer structure 110 may be made of metal materials such as copper.

Referring to FIGS. 4A to 4D, a method for manufacturing a first heat transfer structure 110 may include preparing a metal layer 111 and an insulating layer 112 (FIG. 4A), forming a heat transfer structure by stacking the metal layer 111 and the insulating layer 112 (FIG. 4B), and cutting the heat transfer structure in which the metal layer 111 and the insulating layer 112 are stacked into a unit heat transfer structure which may be inserted into a cavity C1 (FIG. 4C) and may further include forming the copper plating layer 114 on the surface of the unit heat transfer structure 110 (FIG. 4D).

Further, the surface of the unit heat transfer structure 110 may be provided with the primer layer 113 and the surface of the unit heat transfer structure is provided with the copper plating layer 114 and then may be further provided with the primer layer 113.

In this case, as the metal layer 111, a copper foil (Cu foil) or an aluminum foil (Al foil) may be used. Here, when the first heat transfer structure 110 is manufactured by alternately stacking the metal layer 111 and the insulating layer 112 as described in the exemplary embodiment of the present disclosure, a general PCB stacking mechanism is used, such that manufacturing costs may be saved. Accordingly, the so manufactured unit heat transfer structure is used as the first heat transfer structure which is inserted into the insulating part of the circuit board.

According to the exemplary embodiment of the present disclosure, the insulating part 120 is formed as one insulating layer or formed as a plurality of insulating layers. Here, FIG. 1 illustrates a case in which the insulating part 120 is formed of three insulating layers 10, 121, and 121' and an insulating layer located at a central portion is a core part 10, but the exemplary embodiment of the present disclosure is not limited thereto.

According to the exemplary embodiment of the present disclosure, the first heat transfer structure 110 is located at the middle of the insulating part 120. When the core part 10 is provided as illustrated, the cavity C1 penetrating through the core part 10 is provided, and thus the first heat transfer structure 110 may be inserted into the cavity C1.

According to the exemplary embodiment of the present disclosure, a via which is formed in the insulating part 120 may contact the first heat transfer structure 110. Hereinafter, a via which is located at an upper portion of the first heat transfer structure 110 is referred to as a first via V1 and a via which is located at a lower portion thereof is referred to as a second via V2. In this case, the insulating part 120 may be provided with at least one metal pattern. Hereinafter, a metal pattern contacting the first via V1 is referred to as a first metal pattern 131 and a metal pattern contacting the second via V2 is referred to as a second metal pattern 141. Further, the insulating part 120 may be provided with a fourth via V4 and a fifth via V5 and a metal pattern contacting one end of the fourth via V4 is referred to as a fourth metal pattern 142 and a metal pattern contacting the other end of the fifth via V5 is referred to as a fifth metal pattern 143.

As compared with a case in which the shape of the lower surface and the upper surface of the first heat transfer structure 110 is a circular shape or an oval shape, a case in which a shape of a lower surface and an upper surface of the first heat transfer structure 110 is a polygon, in particular, a quadrangular shape may meet a tendency of miniaturization of a first electronic component 500, miniaturization of the circuit board 100, fineness of a pattern pitch, and the like. Further, as illustrated, the first heat transfer structure 110 has a volume much larger than that of general vias such as the first via V1 to seventh via V7. Therefore, the surface of the first heat transfer structure 110, in particular, the upper surface or the lower surface thereof may contact the plurality of vias. That is, an area of the upper surface and the lower surface of the first heat transfer structure 110 itself is larger than the typical vias and the entire volume thereof is also two times larger than that thereof. Therefore, heat from a heat source is rapidly absorbed, and thus may be dispersed to other paths which are connected to the first heat transfer structure 110. Further, when a thickness of the first heat transfer structure 110 is increased, a distance between the first heat transfer structure 110 and a hot spot is reduced and thus the time for which heat of the hot spot moves to the first heat transfer structure 110 may be more shortened.

According to the exemplary embodiment of the present disclosure, one side of the circuit board 100 may be mounted with the first electronic component 500. Further, the circuit board 100 may be mounted at one side of an additional substrate 800 such as a main board. Here, the first electronic component 500 may be a component such as application processor (AP) and may generate heat when being operated.

Meanwhile, heat is generated in response to the operation of the first electronic component 500. Here, when the generated heat is sensed, heat is relatively much generated and thus a region in which temperature is measured highly is present. The region is referred to as the hot spot. The hot spot may be formed in a predetermined region in the circuit board 100, and in particular, the hot spot is formed around the entire or a portion of the first electronic component 500. Further, the hot spot may be formed around a terminal of a power supply of the first electronic component 500 or may be formed in a region in which switching devices are relatively dense.

On the other hand, the first electronic component 500 may include a region having a relatively higher-performance specification and a region having a relatively lower-performance specification, respectively. For example, a processor to which cores having a clock speed of 1.8 GHz are connected and a processor to which cores having a clock speed of 1.2 GHz are connected may be provided in different regions in the first electronic component 500. Referring to FIG. 3, according to the exemplary embodiment of the present disclosure, the first electronic component 500 may include a first unit region 510 and a second unit region 520. In this case, the first unit region 510 performs an operation process faster than the second unit region 520, and as a result, the first unit region 510 may consume more power than the second unit region 520 and generate more heat than the second unit region 520.

In the circuit board 100 according to the exemplary embodiment of the present disclosure, the first heat transfer structure 110 is located in a region adjacent to the hot spot. Therefore, the first heat transfer structure 110 may rapidly receive the heat generated from the hot spot and may disperse heat to other region of the circuit board 100 or to other devices such as a main board, and the like which are coupled with the circuit board 100.

According to the exemplary embodiment of the present disclosure, at least a portion of the first heat transfer structure 110 is located in a vertical lower region of the first electronic component 500.

Meanwhile, the circuit board 100 according to the exemplary embodiment of the present disclosure may be further provided with a second electronic component 200. In this case, devices such as a capacitor, an inductor, and a resistor may correspond to the second electronic component 200.

When the first electronic component 500 is the application processor, the capacitor may be connected to the application processor to reduce power noise. In this case, the shorter the path between the capacitor and the application processor, the larger the power noise decreasing effect.

Therefore, at least a portion of the second electronic component 200 may be located in a region which is vertically down from the first electronic component 500, and thus the power noise decreasing effect may be increased.

According to the exemplary embodiment of the present disclosure, most of the first heat transfer structure 110 may be located in the vertical lower region of the first electronic component 500. Further, the area of the upper surface of the first heat transfer structure 110 may be smaller than that of the upper surface of the first electronic component 500. Further, the area of the upper surface of the first heat transfer structure 110 may be determined to correspond to a width of the hot spot region of the first electronic component 500.

Therefore, the heat of the hot spot may rapidly move to the first heat transfer structure 110. Further, it is advantageous in weight reduction and warpage reduction of the circuit board 100. In addition, it is possible to improve efficiency of a process of disposing the first heat transfer structure 110 on the circuit board 100.

Meanwhile, most of the second electronic component 200 may be located in the region which is vertically down from the first electronic component 500. The second electronic component 200 may be located in a region in which the foregoing first heat transfer structure 110 is not located in the region which is vertically down from the first electronic component 500. Further, the first heat transfer structure 110 may be located at a closer region to the hot spot than the second electronic component 200.

Referring to FIGS. 1 to 6, it may be understood that the first heat transfer structures 110 and the second electronic components 200 may be inserted into the cavities provided in a first core layer 11. That is, the first cavity C1 and a second cavity C2 are provided in the core part 10, and thus the first heat transfer structure 110 may be inserted into the first cavity C1 and the second electronic component 200 may be inserted into the second cavity C2. Further, it may be understood that the first heat transfer structures 110 and the second electronic components 200 may be adjacently disposed to each other in the region which is vertically down from the first electronic component 500, in particular, the first heat transfer structures 110 may be intensively disposed around the hot spot illustrated in FIG. 3.

Therefore, it is possible to rapidly move the heat of the hot spot while maximizing the power noise decreasing effect by the second electronic component 200.

According to the exemplary embodiment of the present disclosure, the first electronic component 500 may be coupled with the circuit board 100 by a solder S, and the like. In this case, the first electronic component 500 may be coupled with the foregoing first metal pattern 131, a third metal pattern 133, a seventh metal pattern 134, and the like by the solder S.

Further, a second metal pattern 141, a fourth metal pattern 142, a fifth metal pattern 143, a sixth metal pattern 144, and the like of the circuit board 100 may be connected to the additional substrate 800, such as a main board, via the solder S. According to the exemplary embodiment of the present disclosure, a third heat transfer structure L1 which is formed of a similar material and shape to the first heat transfer structure 110 instead of the typical solder S may be provided between the second metal pattern 141 and the additional substrate 800. That is, to rapidly transfer the heat of the first heat transfer structure 110 to the additional substrate 800, the second metal pattern 141 may be connected to the additional substrate 800 by using the third heat transfer structure L1 which is made of a material having heat conductivity larger than that of the typical solder S. Further, a heat dissipation part L2 may be provided on the additional substrate 800 to rapidly receive the heat of the third heat transfer structure L1 so as to disperse or diffuse the heat. The heat dissipation part L2 is exposed toward the upper surface of the additional substrate 800 and is exposed toward the lower surface thereof as needed, thereby improving heat diffusion efficiency.

Therefore, the heat generated from the hot spot may be rapidly transferred to the additional substrate 800 via a path of first metal pattern 131-first via V1-first heat transfer structure 110-second via V2-second metal pattern 141.

Meanwhile, as illustrated in FIG. 1, when the first metal pattern 131 to the seventh metal pattern 134 are exposed to an outer surface of the insulating part 120, the first to fourth metal patterns 142 may serve as a kind of connection pad. Further, although not illustrated, a solder resist layer may also be provided to protect other portions of the metal pattern, the insulating part 120, and the like while exposing a portion of the metal pattern. Further, the surfaces of the metal patterns which are exposed to an outside of the solder resist layer may be provided with various surface treatment layers such as a nickel-gold plating layer.

On the other hand, when a terminal which is connected to the first metal pattern 131 among terminals of the first electronic component 500 is a signal transmitting and receiving terminal, the path which includes the first via V1, the first heat transfer structure 110, the second via V2, and the second metal pattern 141 may perform a signal transmission function. In this case, the connection pad of the additional substrate 800 or the terminals which are connected to the second metal pattern 141 may also perform the signal transmission function. In this case, there is a need to use the first heat transfer structure 110 of which the surface is not provided with the copper plating layer 114 to prevent a signal from being transferred to peripheral paths.

On the other hand, when the terminal which is connected to the first metal pattern 131 among the terminals of the first electronic component 500 is not the signal transmitting and receiving terminal, the path which includes the first via V1, the first heat transfer structure 110, the second via V2, and the second metal pattern 141 may be electrically connected to a separate ground terminal (not illustrated). In this case, the connection pad of the additional substrate 800 or the terminals which are connected to the second metal pattern 141 may also be electrically connected to the separate ground terminal (not illustrated). Here, the ground terminal may be provided on at least one of the circuit board 100 and the additional substrate 800.

Further, when the terminal which is connected to the first metal pattern 131 among the terminals of the first electronic component 500 is a power supply terminal, the path which includes the first via V1, the first heat transfer structure 110, the second via V2, and the second metal pattern 141 may be electrically connected to a separate power supplying circuit (not illustrated). In this case, the connection pad of the additional substrate 800 or the terminals which are connected to the second metal pattern 141 may also be electrically connected to the separate power supplying circuit (not illustrated). Here, the power supplying circuit may be provided on at least one of the circuit board 100 and the additional substrate 800. Even in this case, there is a need to use the first heat transfer structure 110 of which the surface is not provided with the copper plating layer 114 to prevent a signal from being transferred to peripheral paths.

Further, the terminal which is connected to the first metal pattern 131 among the terminals of the first electronic component 500 may be a dummy terminal. In this case, the dummy terminal may serve as only a path through which the heat of the first electronic component 500 is transferred to the outside of the first electronic component 500.

Referring to FIGS. 1 to 8, the circuit board 100 according to the exemplary embodiment of the present disclosure may include the core part 10. The core part 10 may serve to relieve a problem which is caused due to a warpage by reinforcing rigidity of the circuit board 100. Further, a material having large heat conductivity is included in the core part 10, and as a result, heat generated from a local region such as the foregoing hot spot may be rapidly dispersed to other portions of the circuit board 100, thereby relieving the problem due to overheating.

Meanwhile, a first upper insulating layer 121 may be provided on the upper surface of the core part 10 and a first lower insulating layer 121' may be provided on the lower surface of the core part 10. Further, if necessary, a second upper insulating layer 122 and a second lower insulating layer 122' may also be further provided.

According to the exemplary embodiment of the present disclosure, a second heat transfer structure may be included in the core part 10. For example, the core part 10 may include the first core layer 11 made of graphite, graphene, or the like. Here, the graphite, and the like has excellent heat conductivity in an XY plane direction, and therefore, heat may be effectively and rapidly diffused.

According to the exemplary embodiment of the present disclosure, the second heat transfer structure may directly contact a side of the first heat transfer structure 110. For example, the side of the second heat transfer structure is exposed to the first cavity C1 which is provided in the core part 10 and the first heat transfer structure 110 may contact the first cavity C1. According to another exemplary embodiment of the present disclosure, a material having high heat conductivity may also be provided in the region between the second heat transfer structure and the first heat transfer structure 110. In this case, as the material having high heat conductivity, a thermal interface material (TIM) may be applied. The TIM may include a polymer-metal composite material, a ceramic composite material, a carbon-based composite material, and the like. For example, a material (heat conductivity of about 660 W/mk) in which epoxy and a carbon fiber filler are mixed, silicon nitride ($Si_3N_4$, heat conductivity of about 200 to 320 W/mk), epoxy, and boron nitride (BN, heat conductivity of about 19 W/mk) may be applied as the thermal interface material. Therefore, the heat introduced into the first heat transfer structure 110 may move in a vertical direction and may be rapidly dispersed even in a horizontal direction through the second heat transfer structure.

As such, as the first heat transfer structure 110 directly contacts the second heat transfer structure or the first heat transfer structure 110 is connected to the second heat transfer structure via the TIM, it is possible to more rapidly disperse heat than the case in which the heat of the first electronic component 500, and the like rapidly moves to the first heat transfer structure 110 and then is transferred only downwardly. Further, from the viewpoint of the circuit board 100, as compared with the case in which temperature excessively rises only in a specific region of the hot spot, and the like, heat is uniformly dispersed over the whole of the circuit board 100, and thus a deviation in temperature of various components or elements mounted on the circuit board 100, respectively may be relieved, thereby improving the reliability. Further, heat is rapidly dispersed to the whole of the circuit board 100, and therefore the whole of the circuit board 100 serves as a kind of heat dissipation plate, thereby implementing the effect that a heat dissipation area may be increased.

According to the exemplary embodiment of the present disclosure, a first circuit pattern P1, a second circuit pattern P2, and the like may be provided on the surface of the core part 10 and the first circuit pattern P1 may be electrically connected to the second circuit pattern P2 through a through via TV which penetrates through the core part 10. Further, the first circuit pattern P1 may be connected to the third metal pattern 133 through the fourth via V4 and the second circuit pattern P2 may be connected to the fourth metal pattern 142 through the fifth via V5. Further, the third metal pattern 133 may be connected to the first electronic component 500 by the solder S and the fourth metal pattern 142 may be connected to the connection pad 810 of the additional substrate 800 by the solder S. Therefore, the electrical signal may be transmitted and received between the first electronic component 500 and the additional substrate 800.

Meanwhile, the second core layer 12 may be provided on one surface of the first core layer 11 and the third core layer 13 may be provided on the other surface of the first core layer 11. According to the exemplary embodiment of the present disclosure, at least one of the second core layer 12 and the third core layer 13 may be made of an insulating material such as PPG. According to another exemplary embodiment of the present disclosure, the second core layer 12 and the third core layer 13 may be made of metals such as copper or Invar. According to another exemplary embodiment of the present disclosure, the first core layer 11 may be made of Invar and the second core layer 12 and the third core layer 13 may be made of copper. Here, when at least one of the second core layer 12 and the third core layer 13 is made of a conductive material, the surface of the core part 10 is provided with the first circuit pattern P1, the second circuit pattern P2, or the like, and thus the signal may be transmitted to the unexpected path, such that a means for securing insulation may be provided on the surface of the core part 10.

According to the exemplary embodiment of the present disclosure, the second electronic component 200 is inserted into the second cavity C2 of the core part 10. Further, the second electronic component 200 may be connected to the seventh metal pattern 134 through a sixth via V6 and may be connected to the sixth metal pattern 144 through a seventh via V7. Meanwhile, the second electronic component 200 may be passive devices such as an inductor and a capacitor and if necessary, active devices such as an IC may also be mounted as the second electronic component 200. In particular, when the second electronic component 200 is the capacitor, the terminal of the first electronic component 500 which is connected to the seventh metal pattern 134 may be a power supply terminal. That is, the second electronic component 200 is mounted as a decoupling capacitor and thus serves to reduce the power noise of the first electronic component 500.

In this case, the shorter the path between the second electronic component 200 and the first electronic component 500, the larger the noise decreasing effect. To this end, in the circuit board 100 according to the exemplary embodiment of the present disclosure, at least a portion of the second electronic component 200 is disposed in the region which is vertically down from the first electronic component 500.

Although not illustrated, instead of the cavity penetrating through the core part 10, a recess part in which a portion of the core part 10 is depressed may be provided, and the first heat transfer structure 110 or the second electronic component 200 may be inserted into the recess part.

Meanwhile, referring to FIG. 1, the thickness of the first heat transfer structure 110 may be implemented to be thicker than a thickness from the lower surface of the circuit pattern P2 to the upper surface of the first circuit pattern P1. Further, the upper surface of the first heat transfer structure 110 may be located to be closer to the upper surface of the circuit board 100 than to the upper surface of the first circuit pattern P1. Therefore, further, the distance between the first heat transfer structure 110 and the hot spot is reduced and thus the time for which the heat of the hot spot moves to the first heat transfer structure 110 may be more shortened.

Referring to FIG. 8, the surface of the core part 10 is provided with the insulating layer 14. According to the exemplary embodiment of the present disclosure, the first core layer 11 to the third core layer 13 may have heat conductivity and electrical conductivity. Therefore, when the surface of the core part 10 is provided with the first circuit pattern P1, and the like, there is a need to prevent the phenomenon that electricity is conducted to the undesirable path by the core part 10. Here, the insulating layer 14 may be formed by vapor-depositing parylene, and the like on the surface of the core part 10. That is, in the state in which the through via hole for forming the through via TV illustrated in FIG. 6 is machined in the core part 10, the insulating material is provided on the surface of the core part 10, thereby forming the insulating layer 14 even in the through via TV hole. Therefore, the insulation between the through via TV, the first circuit pattern P1, or the second circuit pattern P2, and the like and the core part 10 may be secured.

Meanwhile, according to the exemplary embodiment of the present disclosure, a core via hole which penetrates through the second core layer 12 and the third core layer 13 to expose a portion of the first core layer 11 may be formed. An eighth via formed by filling the conductive material in the core via hole may directly contact the first core layer 11. Here, when the insulating layer 14 is formed on the surface of the core part 10 in the state in which the core via hole is provided, the insulating layer 14 is formed even on the exposed surface of the first core layer 11, and therefore the first core layer 11 and the eighth via V8 may contact each other, having the insulating layer 14 disposed therebetween. When heat moves to the eighth via V8 which directly (or indirectly when the insulating layer 14 is present) contacts the first core layer 11, heat may be rapidly dispersed to the circuit board 100 in a horizontal direction along the first core layer 11.

According to the exemplary embodiment of the present disclosure, the second heat transfer structure may be made of graphite or graphene. In this case, the graphite, the graphene, or the like has a relatively low interlayer adhesion. Therefore, the second heat transfer structure is damaged while the circuit board 100 is manufactured or the interlayer adhesion is weakened even after the circuit board 100 is completed, thereby causing the problem of reliability.

As illustrated in FIG. 8, a through hole 11c is provided in the first core layer 11 and the second core layer 12 and the third core layer 13 are integrally connected to each other through the through hole 11c to firmly support the first core layer 11. Therefore, even though the first core layer 11 is made of graphite, and the like, the interlayer adhesion may be reinforced.

As set forth above, according to the exemplary embodiments of the present disclosure, it is possible to lighten and miniaturize the circuit board and provide the circuit board with the improved heat dissipation performance, in particular, the improved heat dissipation performance in the vertical direction.

Further, it is possible to effectively cope with the problem of heat dissipation due to the improvement in performance of electronics, by improving the heat dissipation performance while securing the reliability of the circuit board.

Further, it is possible to save the manufacturing costs, by stacking the first heat transfer structure using the typical process of manufacturing a printed circuit board.

The present disclosure has been described in connection with what is presently considered to be practical exemplary embodiments. In addition, the above-mentioned description discloses only the exemplary embodiments of the present disclosure. Therefore, it is to be appreciated that modifications and alterations may be made by those skilled in the art without departing from the scope of the present disclosure disclosed in the present specification and an equivalent thereof. The exemplary embodiments described above have been provided to explain the best state in carrying out the present disclosure. Therefore, they may be carried out in other states known to the field to which the present disclosure pertains in using other disclosures such as the present disclosure and also be modified in various forms required in specific application fields and usages of the disclosure. Therefore, it is to be understood that the disclosure is not limited to the disclosed embodiments. It is to be understood that other embodiments are also included within the spirit and scope of the appended claims.

What is claimed is:

1. A circuit board comprising:
an insulating part;
a first heat transfer structure comprising a plurality of metal layers and a plurality of insulating layers and having at least a portion thereof inserted into the insulating part, each of the plurality of insulting layers alternately stacked with each of the plurality of the metal layers, each of the plurality of metal layers formed in a direction of thickness of the circuit board;
a metal pattern formed on the insulating part;
a copper plating layer covering surfaces of the first heat transfer structure so as to connect the plurality of metal layers with one another; and
a via formed in the insulating part and having one surface thereof in contact with the copper layer and an opposite surface of the one surface thereof in contact with a surface of the metal pattern.

2. The circuit board according to claim 1, further comprising:
a coupling member coupled with the metal pattern; and
a first electronic component contacting the coupling member.

3. The circuit board according to claim 1, wherein at least one of heat and an electrical signal passes to the metal pattern.

4. The circuit board according to claim 1, wherein the first heat transfer structure is embedded in the insulating part,
wherein the via comprises:
a first via formed above the first heat transfer structure and having one surface thereof in contact with an upper surface of the first heat transfer structure; and
a second via formed below the first heat transfer structure and having one surface thereof in contact with a lower surface of the first heat transfer structure, and
wherein the metal pattern comprises:
a first metal pattern contacting an opposite surface of the one surface of the first via; and
a second metal pattern contacting an opposite surface of the one surface of the second via.

5. The circuit board according to claim 4, wherein the first metal pattern contacts a first coupling member and the first coupling member contacts a first electronic component.

6. The circuit board according to claim 5, wherein the second metal pattern contacts a second coupling member, the second coupling member contacts an additional substrate, and heat generated from the first electronic component is transferred to the additional substrate via the first coupling member, the first metal pattern, the first via, the first heat transfer structure, the second via, the second metal pattern, and the second coupling member.

7. The circuit board according to claim 6, wherein the second coupling member is coupled with an upper surface of a heat dissipation part which have an upper surface and a lower surface exposed by penetrating through the additional substrate and is made of a heat conductive material.

8. The circuit board according to claim 7, wherein the second coupling member is made of a heat conductive material.

9. The circuit board according to claim 5, wherein heat generated from the first electronic component is transferred to the first heat transfer structure via the first coupling member, the first metal pattern, and the first via.

10. The circuit board according to claim 4, wherein at least one of the first via and the second via is provided in plural.

11. The circuit board according to claim 4, wherein the second metal pattern contacts a second coupling member and the second coupling member contacts an additional substrate.

12. The circuit board according to claim 11, wherein heat generated from the first heat transfer structure is transferred to the additional substrate via the second via, the second metal pattern, and the second coupling member.

13. The circuit board according to claim 1, wherein a surface of the first heat transfer structure is provided with a primer layer.

14. The circuit board according to claim 13, wherein the primer layer includes a silane-based material or acrylic silane.

15. The circuit board according to claim 1, further comprising:
a primer layer covering the copper plating layer.

16. The circuit board according to claim 1, wherein an upper portion of the circuit board is provided with a first electronic
component, and
at least a portion of the first heat transfer structure is located vertically down from the first electronic component.

17. The circuit board according to claim 16, further comprising:
a second electronic component provided within the insulating part and having at least a portion located vertically down from the first electronic component.

\* \* \* \* \*